United States Patent [19]

Das et al.

[11] 4,344,045

[45] Aug. 10, 1982

[54] PHASE LOCKED LOOP FREQUENCY SYNTHESIZER WITH FINE TUNING

[75] Inventors: Tapan K. Das; Martin A. Fryer, both of Swindon, England

[73] Assignee: Plessey Handel und Investments AG, Zug, Switzerland

[21] Appl. No.: 87,723

[22] Filed: Oct. 24, 1979

[30] Foreign Application Priority Data

Nov. 2, 1978 [GB] United Kingdom ............... 43000/78

[51] Int. Cl.³ ............................................. H03L 7/18
[52] U.S. Cl. ..................................... 331/1 A; 331/16; 331/25
[58] Field of Search ..................... 331/1 A, 16, 18, 25; 455/260; 358/194.1, 195.1

[56] References Cited

U.S. PATENT DOCUMENTS 4,078,213 3/1978 Campioni .......................... 331/16 X
4,123,724 10/1978 Das et al. ............................ 331/1 A
4,179,670 12/1979 Kingsbury ......................... 331/16 X Primary Examiner—Siegfried H. Grimm
Attorney, Agent, or Firm—Fleit & Jacobson

[57] ABSTRACT

A phase-locked loop frequency synthesizer with fine tuning comprises a controlled oscillator, a divider for dividing signals provided by the oscillator, a comparator for comparing signals derived from the divider with a reference signal and for providing a control signal for the controlled oscillator, a fine tuning circuit for providing a fine tuning control signal, and a pulse generator responsive to the fine tuning control signals for providing one or more control pulses to control the divider. The divider preferably comprises a two modulus divider for dividing by one of two factors for a period dependent upon the number of control pulses provided by the pulse generator, and for dividing by the other of the two factors for the remainder of the time period. The pulse generator preferably comprises a pulse detection and synchronization circuit and a control pulse generator, each connected to the output of the two modulus divider.

12 Claims, 4 Drawing Figures

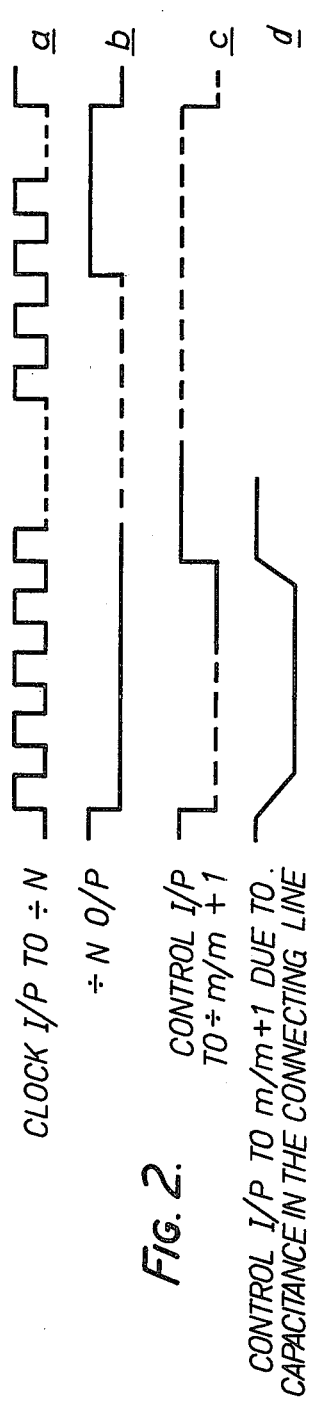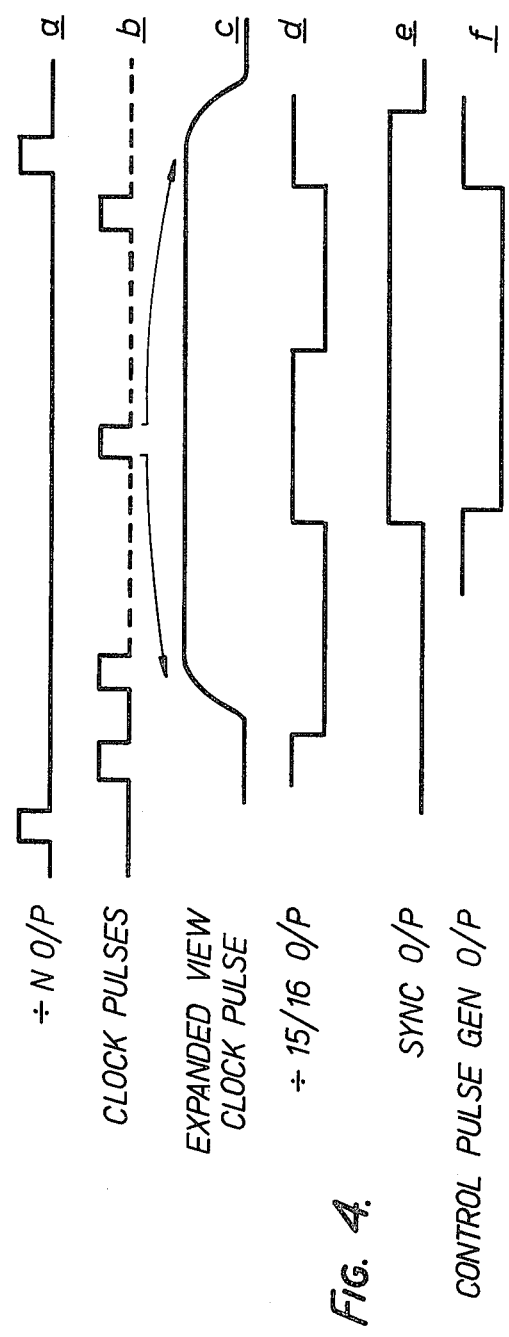

PHASE LOCKED LOOP FREQUENCY SYNTHESIZER WITH FINE TUNING

This invention relates to a frequency synthesiser arrangement and particularly but not exclusively to an arrangement for providing tuning of a television receiver.

In a known synthesiser arrangement a signal provided by a voltage controlled oscillator is divided by a divider having an adjustable division ratio and referred to hereafter as a programmable divider, and is compared in a phase comparator with a reference signal to provide a control signal for the oscillator.

When used to tune a television receiver the voltage controlled oscillator constitutes the local oscillator of the receiver and the division ratio of the programmable divider is changed to effect channel selection.

In order to provide fine tuning of the voltage controlled oscillator a two modulus divider may be introduced between the oscillator and the programmable divider fine tuning being determined by the number of times the two modulus divider divides by one of its two division ratios compared with the other, a synthesiser arrangement of this type utilising a two modulus divider is described in our co-pending British application No. 32419/76, corresponding to U.S. Pat. No. 4,123,724.

The amount of fine tuning of the oscillator is determined by a count preset into a fine tune counter which clocks down to zero in response to clock pulses. The counter provides an output which is '0' whilst the fine tune counter is counting down from its preset value and is '1' when the count becomes all zero.

The counter output is connected to a control input of the two modulus divider which divides by one of two factors when signals received at the control input are '0' whilst it divides by the other factor when the control input receives '1' signals.

A problem arises with the above described arrangement in that when the synthesiser arrangement is fabricated in integrated form the two modulus divider is not included in the same integrated circuit package as the programmable divider and the fine tuning counter due to the requirement for significantly different operating speeds. Consequently a connecting line is required between the integrated circuit containing the programmable divider and the fine tuning control logic and the control input pin of the two modulus divider and this line may contain appreciable capacitance.

The effect of the capacitance is to produce different rising and falling edges in the control input signal fed to the two modulus divider and this can cause malfunction of the divider and hence inaccurate fine tuning.

This invention seeks to provide a frequency synthesiser arrangement utilising a two modulus divider for fine tuning a controlled oscillator and in which the above described difficulty is mitigated.

According to this invention there is provided a frequency synthesiser arrangement comprising a controlled oscillator; a divider for dividing signals provided by the oscillator, a comparator for comparing signals derived from the divider with a reference signal and for providing a control signal for the controlled oscillator; a two modulus divider located between the controlled oscillator and the divider; fine tuning means for providing a fine tuning control signal and pulse generator means responsive to the fine tuning control signal for providing one or more control pulses to control the two modulus divider to divide by one of two factors for a period dependent upon the number of control pulses provided by the pulse generator means and for the remainder of time by the other factor.

The divider may be a programmable divider and the comparator may be a phase comparator.

The fine tuning means may comprise means for generating a fine tuning control signal in pulse form and in a preferred form comprises presettable counter means operative to perform a preset count and means for providing pulses during the performance of the said count.

The pulse generator means may comprise means for detecting pulses provided by the fine tuning means and for generating the said one or more pulses in synchronism with output signals provided by the two modulus divider.

The invention will be described further with reference to the accompanying drawings in which:

FIG. 2 is an explanation diagram showing waveforms at points in the arrangement of FIG. 1;

FIG. 4 is an explanatory diagram showing waveforms at points in the arrangement of FIG. 3.

Figure 1:
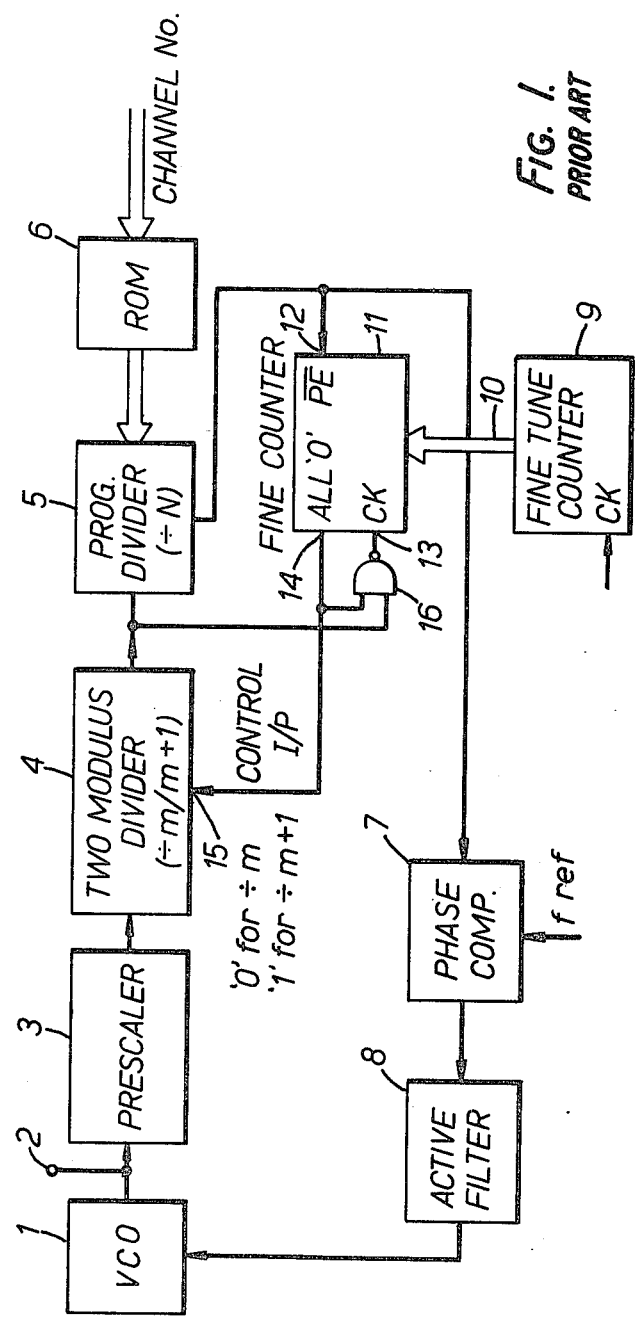
FIG. 1 shows a known synthesiser arrangement.

Referring firstly to FIG. 1 there is shown a known arrangement. By way of example this arrangement is shown as applied to provide channel tuning of a television receiver. A voltage controlled oscillator 1 provides an output at a terminal 2 which acts as a local oscillator signal for a television receiver. The signal provided by the voltage controlled oscillator 1 is fed via a pre-scaler 3 and a two modulus divider 4 to a programmable divider 5 which divides signals derived from the oscillator 1 by a factor N.

The factor N is dependent upon the channel to which the receiver is desired to be tuned and is set by a signal received from a read only memory 6 in response to the selection of a channel. Signals divided by the programmable divider 5 are fed to one input of a phase comparator 7 and are compared with a reference frequency. The phase comparator 7 provides a control signal which after filtering in a filter 8 is fed to a control input of the controlled oscillator which in the stable condition locks onto a frequency corresponding to that of a selected channel.

The two modulus divider 4 is provided in order to enable fine tuning of the controlled oscillator 1 and divides signals fed to it from the oscillator 1 by one of two factors m and m+1 the ratio of the time during which the divider 4 divides by m as compared with m+1 determines the exact amount of fine tuning provided. When fine tuning of the oscillator 1 is required an operator depresses a fine tune control which causes clock signals to be applied to a clock input of a fine tune counter 9 and this counter counts to a value in dependence upon the period of time during which the fine tune control is operated. The fine tune counter 9 is connected over a highway 10 to a fine counter 11. Output signals provided by the programmable divider 5 are also fed to a loading input 12 of the fine counter 11 with the effect that when the output of the programmable divider 5 goes from a high to a low level then the contents of the fine tune counter 9 are loaded into the fine counter 11 over the highway 10.

The fine counter 11 is clocked by means of clock signals applied at a clock input 13 and counts down from the value pre-set from the fine tune counter 9 and whilst counting down provides an output signal at an output 14 which remains at a logical 0 level. The output 14 of the fine counter 11 is connected to a control input 15 of the two modulus divider which is operative to divide by m whilst the control input receives signals at a logical 0 level. The fine counter 11 is clocked synchronously with output signals provided by the two modulus divider 4 and clock signals are applied to the clock input 13 by means of NOR gate 16 which receives as one input output signals provided by the two modulus divider 4 and as a second input output signals from the output 14 of the fine counter 11.

When the fine counter 11 has counted down to all zeros the output 14 provides a signal which becomes logical 1 and this being applied to the control input 15 of the two modulus divider causes this divider to divide thereafter by the factor $m+1$. Also the logical 1 output being provided by the fine counter 11 and applied to the NOR gate 16 causes this gate to be blocked so that clock signals are now withdrawn from the clock input 13 of the fine counter 11 which therefore ceases counting. In operation the fine tune counter 9 is a relatively slow operating counter whilst the fine counter 11 is a fast operating counter capable of performing several cycles of counting during a single counting cycle of the fine tune counter 9.

Waveforms appearing at different points in the circuit are shown in FIG. 2 to which reference will now be made. In line a there is shown the waveform of input signals applied to the programmable divider 5 from the two modulus divider 4 whilst line b shows the divided output waveform provided by the programmable divider 5. The control input waveform applied at the control input 15 to the two modulus divider is shown at line c and whilst this waveform is at a low level, that is logical 0, then the two modulus divider divides by m whilst when the waveform is at a high level, that is logical 1, then the two modulus divider divides by $m+1$.

As explained capacitance on the connecting line between the fine counter 11 and the two modulus divider 4, when these two items are integrated into different integrated circuits, causes inaccurate operation of the two modulus divider. The effect of this capacitance on the signals applied to the control input 15 is shown at line d. This distortion caused by the line capacitance produces malfunction of the two modulus divider and this is alleviated by the arrangement in accordance with the invention described now with reference to FIG. 3.

Figure 3:
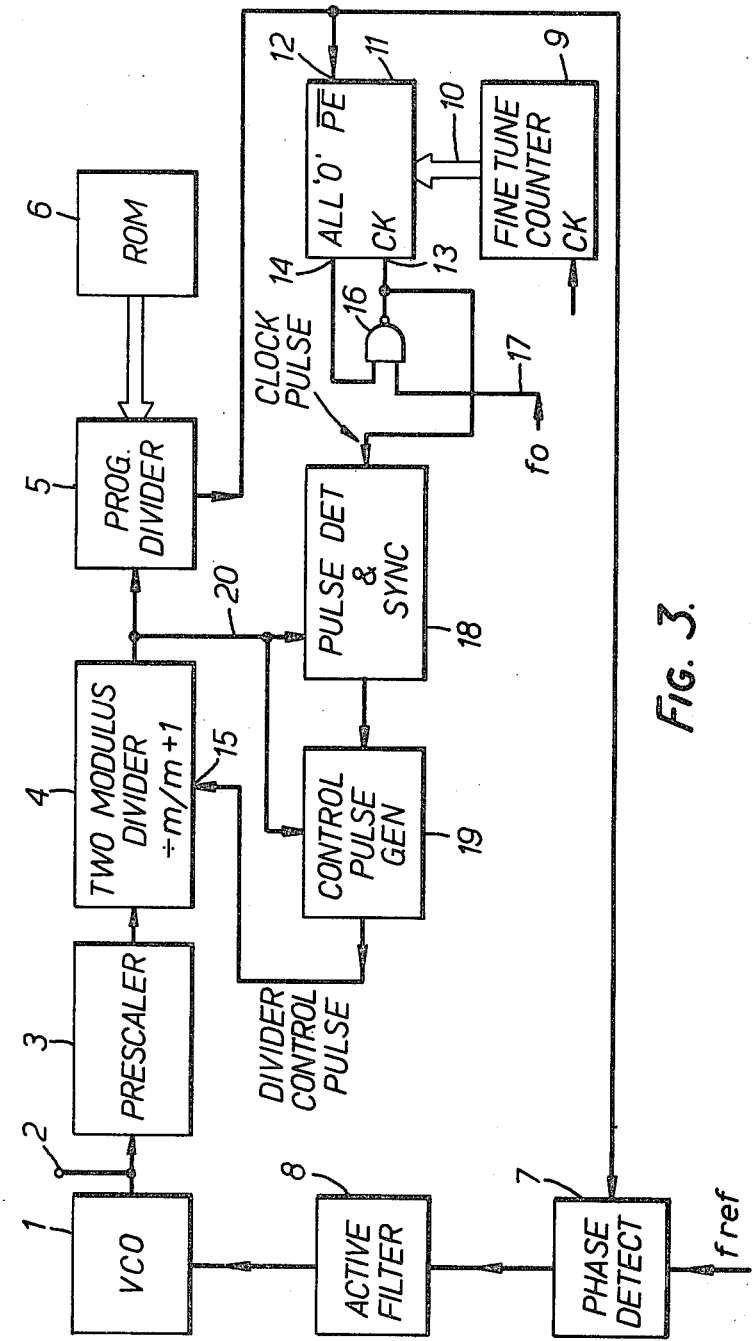
FIG. 3 shows a synthesiser arrangement in accordance with the invention.

Referring to FIG. 3 where like parts to FIG. 1 bear like reference numerals the output 14 from the fine counter 11 is not now connected directly to the control input 15 of the two modulus divider 4 but only to an input of the NOR gate 16. Clock signals to the clock input 13 via the NOR gate 16 do not now originate from the two modulus divider 4 but from a source of clock signals provided over a line 17. The clock signals fed to the clock input 13 of the fine counter 11 are fed also to a pulse detector and synchroniser 18 and then via control pulse generator 19 to the control input 15 of the two modulus divider 4.

As before the output 14 of the counter 11 will be at logical 0 whilst this counter is counting down and therefore during this time clock pulses are fed from the line 17 via the NOR gate 16 to clock the counter 11, the number of clock pulses being determined by the initial count set into the counter 11. The pulse detector and synchroniser 18 detects each clock pulse and, itself being synchronised with the two modulus divider 4 via a line 20, produces a pulse after the output from the two modulus divider 4 changes from one level to another. For example if the pulse detection occurs when the two modulus divider output is high then the synchroniser and detector 18 produces a pulse after the two modulus output goes low. The pulse produced by the pulse detector and synchroniser 18 is passed to the control pulse generator 19 which is also synchronised over the line 20 with the two modulus divider output and this generator 19 synchronises the pulse produced by the synchroniser 18 to the positive or negative edge of the two modulus output and generates a pulse of at least one half cycle duration of the two modulus output. Each output pulse produced by the control generator 19 and fed to the control input 15 of the two modulus divider 4 causes this divider to divide by the division ratio m and then to revert to its normal division ratio $m+1$. The number of times therefore that the two modulus divider divides by the division ratio m as opposed to the ratio $m+1$ is determined by the number of control pulses received on the control input 15 and as described above this is determined by the initial count set into the fine counter 11 which in turn depends upon the amount of fine tuning fed into the fine tune counter 9 by an operator.

The pulse detector and synchroniser 18 is not dependent for this operation upon the shape of clock pulses obtained from the NOR gate 16 but requires merely to detect the existence of a pulse in order to produce a synchronised pulse output. The pulse detector and synchroniser 18 and the control pulse generator 19 can now easily be incorporated in the same integrated circuit as the two modulus divider 4 so that there is no degradation of pulses supplied by the control pulse generator 19 and applied to the control input 15 of the two modulus divider 4 and each pulse causes the divider 4 to divide once by its division ratio m. Further since the detection by the pulse detector and synchroniser 18 is not dependent upon the shape of edges of the pulses fed thereto from the NOR gate 16 then the length of line connecting the NOR gate 16 to the integrated circuit containing the two modulus divider 4 is unimportant and the effects of line capacitance are overcome. A further advantage of this invention is that the clock pulses fed to the pulse detector and synchroniser 18 do not now need to be synchronous with the output of the two modulus divider 4 so that phase delays in the programmable divider and the counters 9 and 11 have no effect on the fine tuning operation.

FIG. 4 shows the waveforms appearing at various points in the arrangement of FIG. 3. Line a shows the output of the programmable divider 5 whilst line b shows clock pulses fed to the pulse detector and synchroniser 18. Line c shows an expanded view of one clock pulse. Line d shows output waveforms provided by the two modulus divider 4 whilst the line e shows an output pulse provided by the pulse detector and synchroniser 18. As can be seen this pulse has a positive edge which is synchronised with the positive edge of the output from the two modulus divider 4 and the negative edge is synchronised with the negative edge of the clock pulse shown in line c. The control pulse generator produces a pulse of one cycle of the output of the two modulus divider 4.

As a typical example of the operation of the arrangement of FIG. 3 assume that the pre-scaler 3 has a division ratio of 64, the two modulus divider has division ratios of $\div 15/16$ $f_{ref} = 1.953125$ KHz then fine tuning step $64 \times 1.953125$ KHz $= 125$ KHz If the two modulus divider has to cover 2 MHz fine tuning range then the maximum number of control pulses required $= 2$ MHz$/125$ KHz $= 16$, since for each control pulse the two modulus divider divides by 15 only once.

The clock frequency $f_c$ of the fine counter is given by $f_c \geq 16\, f_{ref}$.

The invention has been described by way of example and it must be appreciated that modifications may be made without departing from the scope of the invention. For example division ratios of the two modulus divider 4 need not necessarily be 15 and 16 and also any one of the two division ratios can be that by which the divider normally divides.

The invention has also been described with particular reference to the tuning of a local oscillator in a television receiver so that the programmable divider 5 is operative in each of its division ratios to select a different one of a number of television channels. The invention however is not restricted to applications in the television field but may be applied to any frequency synthesiser which is required to be fine tuned.

What we claim is:

1. A frequency synthesiser arrangement, comprising:
a controlled oscillator providing oscillation signals;
divider means for dividing said oscillation signals provided by the oscillator to produce divider output signals, said divider means including a two modulus divider providing two modulus divider output signals comprising a waveform having positive and negative going edges;
comparator means for comparing said divider output signals from the divider means with a reference signal so as to provide a control signal for controlling the controlled oscillator;
fine tuning means for providing a fine tuning control signal comprising at least one clock pulse; and
pulse generator means responsive to the fine tuning control signal from the fine tuning means for providing a control pulse in response to each said at least one clock pulse and for synchronizing each said control pulse with one of said positive going edge or said negative going edge, whereby to control the two modulus divider to divide by one of two factors for a first period dependent upon the number of control pulses provided by the pulse generator means, and to control the two modulus divider to divide by the other of the two factors for a second period of time.

2. A frequency synthesiser arrangement as claimed in claim 1 wherein the divider means includes a programmable divider.

3. A frequency synthesiser arrangement as claimed in any one of claims 1 or 2 wherein the comparator means comprises a phase comparator.

4. A frequency synthesiser arrangement as claimed in any one of claims 1 or 2 wherein the fine tuning means generates the fine tuning control signal in pulse form.

5. A frequency synthesiser arrangement, comprising:
a controlled oscillator providing oscillation signals;
divider means for dividing said oscillation signals provided by the oscillator to produce divider output signals, said divider means including a two modulus divider providing two modulus divider output signals;
comparator means for comparing said divider output signals from the divider means with a reference signal so as to provide a control signal for controlling the controlled oscillator;
fine tuning means for providing a fine tuning control signal; and
pulse generator means responsive to the fine tuning control signal from the fine tuning means for providing at least one control pulse in synchronisation with said two modulus divider output signals, said at least one control pulse being provided to said two modulus divider to control the two modulus divider to divide by one of two factors for a first period dependent upon the number of control pulses provided by the pulse generator means, and to control the two modulus divider to divide by the other of the two factors for a second period of time;
wherein the fine tuning means generates the fine tuning control signal in pulse form;
wherein the fine tuning means comprises a presettable counter operative to perform a preset count and pulse means operatively associated with the presettable counter for providing pulses during the performance of the set count, said pulses provided by said pulse means comprising said fine tuning control signals.

6. A frequency synthesiser arrangement as claimed in claim 5 wherein the pulse generator means comprises detector means for detecting the pulses provided by the pulse means and for generating said at least one control pulse in response thereto.

7. A frequency synthesiser arrangement as claimed in any one of claims 1 or 2, wherein the pulse generator means comprises a pulse detector and synchronisation circuit connected to said fine tuning means and to said two modulus divider for detecting each said at least one clock pulse, and for generating an output once said two modulus divider is controlled by a different one of the two factors.

8. A frequency synthesiser arrangement as claimed in claim 7, said pulse generator means further comprising a control pulse generator connected to said pulse detector and synchronisation circuit and to said two modulus divider, said control pulse generator being responsive to said output of said pulse detector and synchronisation circuit so as to synchronise said output of said pulse detector and synchronisation circuit with one of the positive going edge or negative going edge of said two modulus divider output signals, whereby to generate said control pulse.

9. A frequency synthesiser arrangement as claimed in claim 8, wherein the two modulus divider output signals include pulses of given duration, and wherein said control pulse generator generates said at least one control pulse of said pulse generator means with a duration equal to one-half the given duration of said two modulus divider output signals.

10. A frequency synthesiser arrangement, comprising:
a controlled oscillator providing oscillation signals;
divider means for dividing said oscillation signals provided by the oscillator to produce divider output signals, said divider means including a two modulus divider providing two modulus divider output signals;

comparator means for comparing said divider output signals from the divider means with a reference signal so as to provide a control signal for controlling the controlled oscillator;

fine tuning means for providing a fine tuning control signal; and pulse generator means responsive to the fine tuning control signal from the fine tuning means for providing at least one control pulse in synchronisation with said two modulus divider output signals, said at least one control pulse being provided to said two modulus divider to control the two modulus divider to divide by one of two factors for a first period dependent upon the number of control pulses provided by the pulse generator means, and to control the two modulus divider to divide by the other of the two factors for a second period of time;

wherein the fine tuning control signal comprises a series of clock pulses, and the pulse generator means comprises a pulse detector and synchronisation circuit connected to said fine tuning means and to said two modulus divider for detecting each pulse of said series of clock pulses, and for generating an output once said two modulus divider is controlled by a different one of the two factors.

11. A frequency synthesiser arrangement as claimed in claim 10, wherein the two modulus divider output signals comprise a waveform having positive and negative edges, said pulse generator means further comprising a control pulse generator connected to said pulse detector and synchronisation circuit and to said two modulus divider, said control pulse generator being responsive to said output of said pulse detector and synchronisation circuit so as to synchronise said output of said pulse detector and synchronisation circuit with one of the positive edge or negative edge of said two modulus divider output signals, whereby to generate said at least one control pulse.

12. A frequency synthesiser arrangement as claimed in claim 11, wherein the two modulus divider output signals include pulses of given duration, and wherein said control pulse generator generates said at least one control pulse of said pulse generator means with a duration equal to one-half the given duration of said two modulus divider output signals.

* * * * *